United States Patent
Moon et al.

(10) Patent No.: US 9,368,753 B2
(45) Date of Patent: Jun. 14, 2016

(54) DISPLAY DEVICE

(71) Applicant: SAMSUNG DISPLAY CO., LTD., Yongin-si, Gyeonggi-Do (KR)

(72) Inventors: Jeong-Woo Moon, Yongin-si (KR); Kie-Hyun Nam, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/473,280

(22) Filed: Aug. 29, 2014

(65) Prior Publication Data

US 2015/0255754 A1 Sep. 10, 2015

(30) Foreign Application Priority Data

Mar. 10, 2014 (KR) .................. 10-2014-0027584

(51) Int. Cl.
  *H01L 29/20* (2006.01)
  *H01L 29/18* (2006.01)
  *H01L 33/00* (2010.01)
  *H01L 51/52* (2006.01)
  *H01L 27/32* (2006.01)

(52) U.S. Cl.
  CPC ........ *H01L 51/5268* (2013.01); *H01L 51/5284* (2013.01); *H01L 27/3244* (2013.01); *H01L 2251/5369* (2013.01)

(58) Field of Classification Search
  CPC ......... H01L 51/52; H01L 33/00; H01L 51/10; H01L 27/32
  USPC ................... 257/13, 40, 88–90, 98, E51.018; 313/498–506; 438/42, 22, 28
  See application file for complete search history.

(56) References Cited

U.S. PATENT DOCUMENTS

| | | | |
|---|---|---|---|
| 2005/0146266 A1* | 7/2005 | Kuma ................... | H01L 27/322 313/506 |
| 2006/0049745 A1* | 3/2006 | Handa ................. | H01L 51/5268 313/503 |
| 2006/0118789 A1* | 6/2006 | Suh ...................... | H01L 51/0021 257/72 |
| 2006/0186802 A1* | 8/2006 | Cok .................... | H01L 51/5268 313/506 |
| 2006/0186803 A1 | 8/2006 | Lim et al. | |
| 2006/0214152 A1* | 9/2006 | Seo ..................... | H01L 27/3209 257/13 |
| 2006/0220509 A1* | 10/2006 | Ghosh .................... | B82Y 20/00 313/110 |
| 2008/0218066 A1* | 9/2008 | Kim .................... | H01L 51/5221 313/504 |
| 2009/0015142 A1 | 1/2009 | Potts et al. | |
| 2009/0015151 A1* | 1/2009 | Ishihara ............. | H01L 27/3276 313/504 |
| 2009/0051278 A1* | 2/2009 | Saneto ................ | H01L 51/5268 313/504 |
| 2009/0102352 A1* | 4/2009 | Cok ........................ | H05B 33/22 313/498 |

(Continued)

FOREIGN PATENT DOCUMENTS

KR 10-2006-0094160 A 8/2006
KR 10-2007-0065681 A 6/2007

(Continued)

*Primary Examiner* — Amar Movva
*Assistant Examiner* — Sheikh Maruf
(74) *Attorney, Agent, or Firm* — Lee & Morse, P.C.

(57) ABSTRACT

A display device includes a first substrate, a second substrate facing the first substrate, a first electrode on the first substrate, a pixel defining layer on the first substrate, the pixel defining layer including an opening corresponding to the first electrode, a light emission layer on the first electrode, a second electrode on the light emission layer, a filler between the first substrate and the second substrate, and scattering particles in the filler, the scattering particles having an average particle diameter that is less than a maximum height of the pixel defining layer.

12 Claims, 6 Drawing Sheets

(56) References Cited

U.S. PATENT DOCUMENTS

| | | | |
|---|---|---|---|
| 2009/0230841 A1 | 9/2009 | Boerner | |
| 2009/0315450 A1* | 12/2009 | Kim | H01L 51/5259 313/504 |
| 2010/0244036 A1* | 9/2010 | Park | H01L 29/42384 257/72 |
| 2011/0042697 A1* | 2/2011 | Lee | H01L 51/5268 257/89 |
| 2011/0108845 A1* | 5/2011 | Kwon | H01L 27/322 257/72 |
| 2012/0091484 A1* | 4/2012 | Lee | H01L 51/5246 257/91 |
| 2012/0097987 A1* | 4/2012 | Ryu | H01L 51/524 257/88 |
| 2012/0104420 A1* | 5/2012 | Lee | H01L 27/3276 257/88 |
| 2012/0181544 A1* | 7/2012 | Lee et al. | 257/72 |
| 2013/0099659 A1* | 4/2013 | Park | H01L 27/3246 313/504 |
| 2013/0140982 A1* | 6/2013 | Park | H01L 51/5262 313/504 |
| 2013/0228801 A1* | 9/2013 | Lee | H01L 51/5268 257/88 |
| 2013/0299790 A1* | 11/2013 | Kang | H01L 51/5203 257/40 |
| 2015/0003040 A1* | 1/2015 | Bessho | H01L 51/5262 362/84 |
| 2015/0042933 A1* | 2/2015 | Ueki et al. | 349/108 |

FOREIGN PATENT DOCUMENTS

| | | |
|---|---|---|
| KR | 10-2007-0089845 A | 9/2007 |
| KR | 10-2009-0046100 A | 5/2009 |
| KR | 10-2010-0047855 A | 5/2010 |
| KR | 10-1163620 B1 | 7/2012 |

* cited by examiner

DISPLAY DEVICE

CROSS-REFERENCE TO RELATED APPLICATION

Korean Patent Application No. 10-2014-0027584, filed on Mar. 10, 2014, in the Korean Intellectual Property Office, and entitled: "Display Device," is incorporated by reference herein in its entirety.

BACKGROUND

1. Field

Embodiments relate to a display device.

2. Description of the Related Art

In general, flat or otherwise thin panel displays (FPDs) such as liquid crystal displays and organic light emitting diode displays may include opposed electric field generating electrodes and an electro-optically active layer disposed to be affected by correspondingly generated electric fields. In liquid crystal displays, a liquid crystal layer may be included as the electro-optically active layer, and in the case of organic light emitting diode displays, an organic light emitting layer may be included as the electro-optically active layer.

One of the opposed electric field generating electrodes may be connected to a switching element so that it receives an electrical signal on a selective basis. The electro-optically active layer may covert the received electrical signal to a corresponding optical signal and thereby display an image.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding effective filing dates of subject matter disclosed herein.

SUMMARY

Embodiments are directed to a display device including a first substrate, a second substrate facing the first substrate, a first electrode on the first substrate, a pixel defining layer on the first substrate, the pixel defining layer including an opening corresponding to the first electrode, a light emission layer on the first electrode, a second electrode on the light emission layer, a filler between the first substrate and the second substrate, and scattering particles in the filler, the scattering particles having an average particle diameter that is less than a maximum height of the pixel defining layer.

The scattering particles may have an average particle diameter of about 100 nm to about 20 μm.

A difference between refractive indices of the filler and the scattering particles may be about 0.03 to about 0.5.

The filler may include one or more of a silicone resin, an epoxy resin, an acrylic resin, a polyimide resin, or a paraffin resin.

The scattering particles may be polymer beads

The scattering particles may be polymer beads having a glass transition temperature $T_g$ equal to or less than 120° C., and having a value of 10% K equal to or less than 500 kg/cm².

The filler may include the scattering particles in an amount of about 5% to about 40% of the total volume of the filler and the scattering particles.

The scattering particles may include a material having a low visible light absorption.

The filler including the scattering particles may have an outgas amount of about 500 ppm at a temperature of 100° C.

The second electrode may be on the pixel defining layer.

The filler may be between the second electrode and the second substrate.

The display device may further include a black matrix on the pixel defining layer.

The second electrode may be on the pixel defining layer and the black matrix.

The black matrix may be spaced apart from the light emission layer.

The display device may further include a black matrix on the second substrate in a position corresponding to the pixel defining layer.

The display device may further include a color filter pattern between parts of the black matrix.

The color filter pattern may include red, green, and blue color filter patterns.

The filler may be between the black matrix and the second electrode, and between the color filter pattern and the second electrode.

BRIEF DESCRIPTION OF THE DRAWINGS

Features will become apparent to those of skill in the art by describing in detail example embodiments with reference to the attached drawings in which.

DETAILED DESCRIPTION

Figure 1:
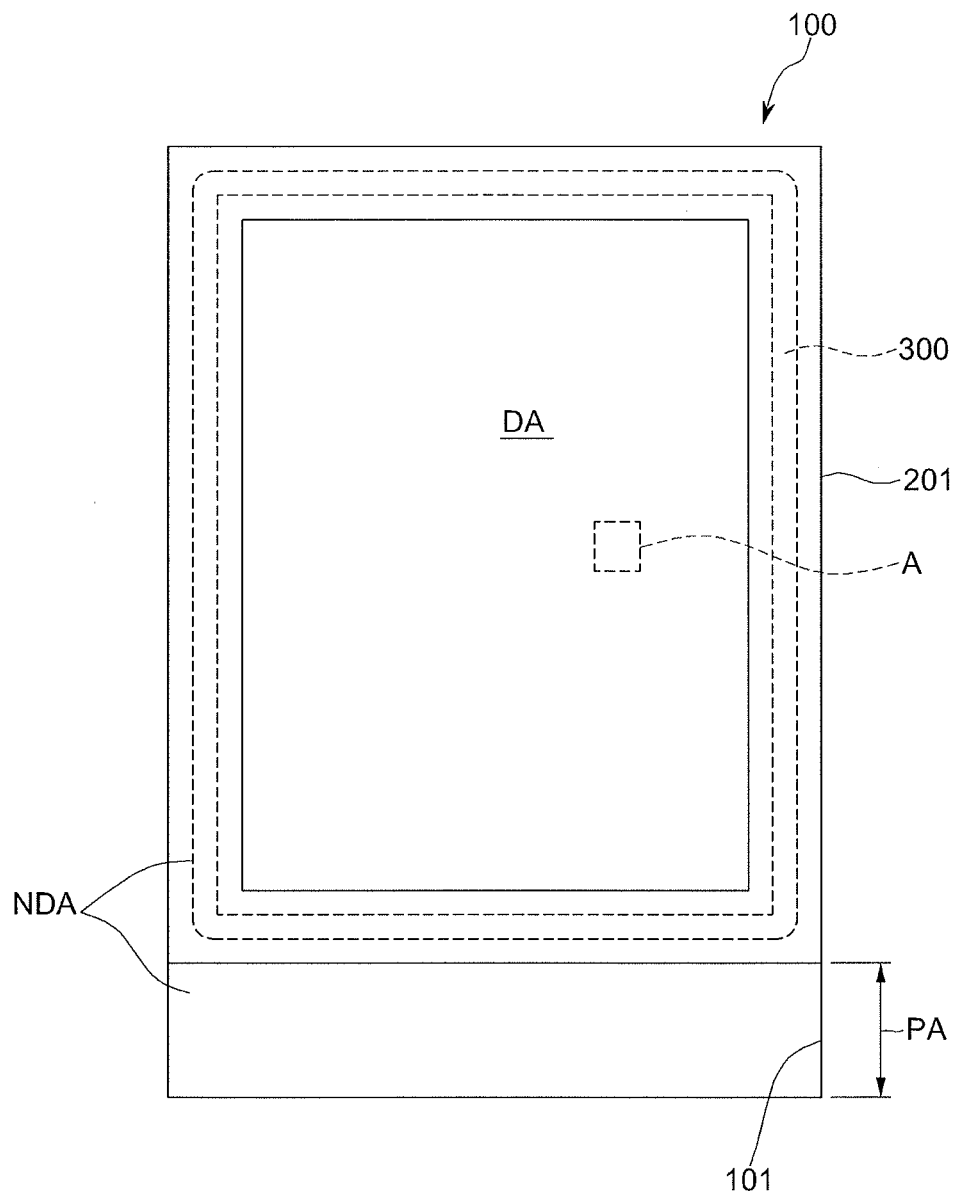
FIG. 1 illustrates a schematic plan view showing a display device according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

The terminology used herein is for the purpose of describing particular embodiments only and should not be construed as limiting. As used herein, the singular forms "a," "an" and "the" are intended to include the plural forms as well, unless the context clearly indicates otherwise. It will be further understood that the terms "comprises," "comprising," "includes," and "including" when used in this specification, specify the presence of mentioned component, step, operation, and/or element, but do not exclude the presence or addition of one or more other components, steps, operations, and/or elements.

Unless otherwise defined, all terms used herein (including technical and scientific terms) have the same meaning as commonly understood by those skilled in the art. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a display device according to a first example embodiment will be fully described with reference to FIGS. 1 to 3. According to the first example embodiment, the display device may be an organic light emitting diode (OLED) display or a liquid crystal display (LCD). Hereinafter, the OLED display will be used as an example of the display device.

FIG. 1 illustrates a schematic plan view showing the display device according to the first example embodiment. FIG. 2 illustrates an enlarged view of area A of FIG. 1. FIG. 3 illustrates a cross-sectional view showing a display area according to the first example embodiment, taken along a line A-A' of FIG. 2, and also showing an area of a second substrate illustrated in FIG. 1, which corresponds to the display area.

In the first example embodiment, referring to FIG. 1, the OLED display 100 may include a first substrate 101, a second substrate 201, and a sealing member 300. In an implementation, the first substrate 101 may be encapsulated by an encapsulation film, not by the second substrate 201.

The first substrate 101 may include an image displaying area DA where an electronically-defined image may be displayed by light emission, and a non-displaying area NDA outside the image displaying area DA. An organic light emitting diode (OLED), a thin film transistor (TFT) configured to drive the OLED, lines, and the like may be disposed in the image displaying area DA. The non-displaying area NDA may include a pad area PA where a plurality of pad electrodes (not shown) are disposed to receive external signals to emit light by the OLED and transmit the external signals to the OLED.

Figure 2:
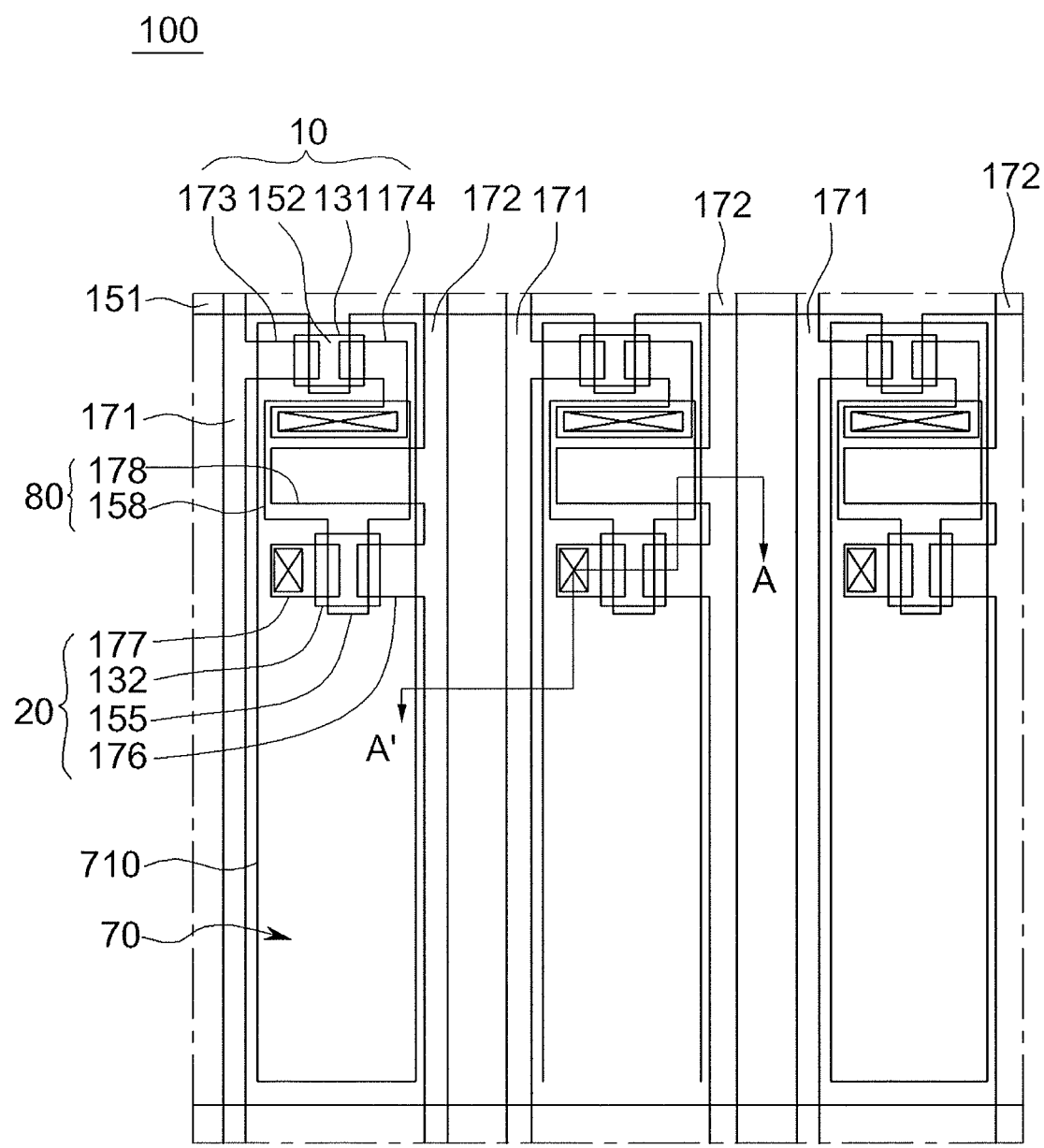
FIG. 2 illustrates an enlarged view of area A of FIG. 1.
Figure 3:
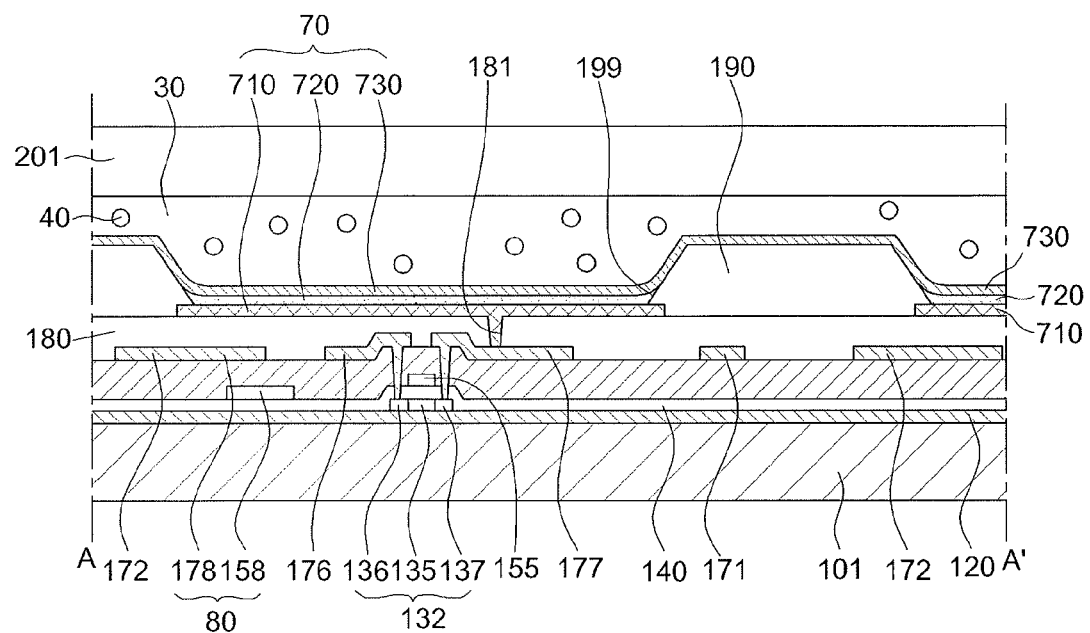
FIG. 3 illustrates a cross-sectional view showing a display area according to the first example embodiment, taken along a line A-A' of FIG. 2, and also showing an area of a second substrate illustrated in FIG. 1, which corresponds to the display area.

Referring to FIGS. 2 and 3, the image displaying area DA will be fully described below.

FIG. 2 illustrates an example of an active matrix (AM) OLED display, which has a 2Tr-1Cap (two transistor—one capacitor) structure having two TFTs 10 and 20 and one capacitor 80 in one pixel of the image displaying area corresponding to "DA" marked in FIG. 1. In another implementation, the OLED display may have three or more TFTs and/or two or more capacitors in one pixel, or may be configured to have various structures by further forming separate lines. In some example embodiments, the pixel may be the smallest unit that displays an image. The image displaying area DA may display an image utilizing a plurality of pixels.

The first substrate 101 may include a switching TFT 10, a driving TFT 20, a capacitor 80, and an OLED 70 per pixel. The first substrate 101 may further include a gate line 151 extending in one direction, and a data line 171 and a common power line 172 that are insulated from and cross (e.g., intersect) the gate line 151.

Each pixel may be defined by the gate line 151, the data line 171, and the common power line 172 as a boundary.

The OLED 70 may include a first electrode 710, an organic light emitting layer 720 on the first electrode 710, and a second electrode 730 on the organic light emitting layer 720. Each pixel may include at least one first electrode 710. The first substrate 101 may include a plurality of first electrodes 710 spaced apart from each other.

The first electrode 710 may be an anode that is a hole injection electrode, and the second electrode 730 may be a cathode that is an electron injection electrode. In another implementation, the first electrode 710 may be a cathode and the second electrode 730 may be an anode depending on the driving method of the OLED display.

Holes and electrons may be injected from the electrodes into the organic light emitting layer 720. The injected holes and electrons may be combined with each other to form an exciton, and light may be emitted when the exciton falls from an excited state to a ground state.

The capacitor 80 may include a pair of storage electrodes 158 and 178 with an insulating layer 160 interposed therebetween. The insulating layer 160 may include a dielectric material. A capacitance of the capacitor 80 may be determined by a charge stored (e.g., energy charged) in the capacitor 80 and a voltage between the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may act as a switching element configured to select a pixel to emit light. The switching gate electrode 152 may be coupled to the gate line 151. The switching source electrode 173 may be coupled to the data line 171. The switching drain electrode 174 may be spaced apart from the switching source electrode 173 and may be coupled to the first storage electrode 158.

The driving TFT 20 may apply driving power to the first electrode 710 for light emission of the organic light emitting layer 720 of the OLED 70 in a selected pixel. The driving gate electrode 155 may be coupled to the first storage electrode 158 that is coupled to the switching drain electrode 174. The driving source electrode 176 and the second storage electrode 178 may each be coupled to the common power line 172.

The driving drain electrode 177 may be coupled to the first electrode 710 of the OLED 70 through a contact hole 181.

With the above-described structure, the switching TFT 10 may be driven by a gate voltage applied to the gate line 151 to transmit a data voltage applied to the data line 171 to the driving TFT 20.

A voltage corresponding to a difference between a common voltage applied from the common power line 172 to the driving TFT 20 and the data voltage transmitted from the switching TFT 10 may be stored in the capacitor 80, and a current corresponding to the voltage stored in the capacitor 80 may flow to the OLED 70 through the driving TFT 20, so that the OLED 70 emits light.

Referring to FIGS. 2 and 3, the image displaying area DA according to example embodiments will be further described below.

FIG. 3 illustrates the OLED 70, the driving TFT 20, the capacitor 80, the data line 171, and the common power line 172. The switching semiconductor layer 131, the switching gate electrode 152, the switching source electrode 173, and the switching drain electrode 174 of the switching TFT 10 may have the same laminated structure as the driving semiconductor layer 132, the driving gate electrode 155, the driving source electrode 176, and the driving drain electrode 177 of the driving TFT 20, respectively, and thus further description thereof will not be provided below.

The first substrate 101 may be an insulating substrate including, e.g., glass, quartz, ceramic, plastic, etc. The first substrate 101 may also be a metal substrate made of stainless steel, etc.

A buffer layer 120 may be disposed on the first substrate 101. The buffer layer 120 may prevent infiltration of undesirable elements such as impurities and moisture, and may provide a planar surface. The buffer layer 120 may be made of a suitable material for planarizing and/or preventing infiltration. For example, the buffer layer 120 may include one or more of silicon nitride ($SiN_s$), silicon oxide ($SiO_2$), or silicon oxynitride ($SiO_xN_y$). In an implementation, the buffer layer 120 may be omitted depending on kinds and process conditions of the first substrate 101.

The driving semiconductor layer 132 may be disposed on the buffer layer 120 of the image displaying area DA. The driving semiconductor layer 132 may be made of one or more of, e.g., polycrystalline silicon, amorphous silicon, or an oxide semiconductor. The driving semiconductor layer 132 may include a channel area 135 that is not doped with impurities, and p+ doped source and drain areas 136 and 137 on the respective sides of the channel area 135. In this case, p-type impurities such as boron B may be used as dopant ions. For example, $B_2H_6$ may be used. Such impurities may vary depending on kinds of the TFTs.

A gate insulating layer 140 including, e.g., silicon nitride ($SiN_x$) or silicon oxide ($SiO_2$) may be disposed on the driving semiconductor layer 132. The gate insulating layer 140 may include one or more of, e.g., tetraethyl orthosilicate (TEOS), silicon nitride ($SiN_x$), or silicon oxide ($SiO_2$). In an implementation, the gate insulating layer 140 may have a double layer structure in which a silicon nitride layer having a thickness of about 40 nm and a TEOS layer having a thickness of about 80 nm are sequentially laminated.

The driving gate electrode 155, the gate line 151, and the first storage electrode 158 may be disposed on the gate insulating layer 140. The driving gate electrode 155 may be disposed to overlap at least a part of the driving semiconductor layer 132, for example, the channel area 135 in particular. The driving gate electrode 155 may serve as a mask to prevent the channel area 135 from being doped with impurities when the source and drain areas 136 and 137 of the driving semiconductor layer 132 are doped with the impurities in the process of forming the driving semiconductor layer 132.

The driving gate electrode 155 and the first storage electrode 158 may be disposed on the same layer, and may include substantially the same metal material. The metal material may include, e.g., one or more of molybdenum (Mo), chromium (Cr), or tungsten (W). For example, the driving gate electrode 155 and the first storage electrode 158 may be made of molybdenum (Mo) or molybdenum-based alloys.

The insulating layer 160 may cover the driving gate electrode 155 and may be disposed on the gate insulating layer 140. The insulating layer 160 may be an interlayer insulating layer. The insulating layer 160 may be made of, e.g., silicon nitride ($SiN_x$) or silicon oxide ($SiO_x$) like the gate insulating layer 140. The gate insulating layer 140 and the insulating layer 160 may include a contact hole to expose the source and drain areas 136 and 137 of the driving semiconductor layer 132.

The driving source electrode 176, the driving drain electrode 177, the data line 171, the common power line 172, and the second storage electrode 178 may be disposed on the insulating layer 160 of the image displaying area DA. The driving source electrode 176 and the driving drain electrode 177 may be respectively coupled to the source and drain areas 136 and 137 of the driving semiconductor layer 132 through the contact hole.

In example embodiments, the driving source electrode 176, the driving drain electrode 177, the data line 171, the common power line 172, and the second storage electrode 178 may be made of at least one refractory metal, e.g., molybdenum, chromium, tantalum, or titanium, or an alloy thereof, and may have a multilayer structure that includes a refractory metal layer and a low resistance conductive layer. Examples of the multilayer structure may include a double layer including a chromium or molybdenum (or an alloy thereof) lower layer and an aluminum (or an alloy thereof) upper layer, and a triple layer including molybdenum (or an alloy thereof) lower layer, aluminum (or an alloy thereof) intermediate layer, and molybdenum (or an alloy thereof) upper layer. The driving source electrode 176, the driving drain electrode 177, the data line 171, the common power line 172, and the second storage electrode 178 may be made of various conductive materials instead of, or in addition to, the above-described materials.

A protective layer 180 may cover the driving source electrode 176, the driving drain electrode 177, and the like, and may be disposed on the insulating layer 160. The protective layer 180 may be made of an organic material, e.g., a polyacryl, a polyimide, etc. The protective layer 180 may be a planarization layer. The protective layer 180 may be made of one or more of, e.g., a polyacrylate resin, an epoxy resin, a phenolic resin, a polyamide resin, a polyimide resin, an unsaturated polyester resin, a polyphenylene ether resin, a polyphenylene sulfide resin, or benzocyclobutene (BCB). The protective layer 180 may include a contact hole 181 that exposes the driving drain electrode 177.

The first electrode 710 may be disposed on the protective layer 180, and the first electrode 710 may be coupled to the driving drain electrode 177 through the contact hole 181 of the protective layer 180.

A pixel defining layer 190 may be configured to cover the first electrode 710 and may be disposed on the protective layer 180. The pixel defining layer 190 may include a first opening 199 to expose the first electrode 710. The first electrode 710 may be disposed to correspond to the first opening 199 of the pixel defining layer 190. The pixel defining layer 190 may be made of one or more of a polyacrylate resin, a polyimide resin, etc.

The second substrate 201 may be bonded and sealed to the first substrate 101 with the OLED 70 interposed therebetween. The second substrate 201 may be configured to cover the TFTs 10 and 20 and the OLED 70 on the first substrate 101 so as to seal them from the outside for protection. The second substrate 201 may generally be an insulating substrate including glass or plastic.

A filler 30 may be disposed between the first and second substrates 101 and 201. The filler 30 may include scattering particles 40. Further description of the filler 30 and the scattering particles 40 will be provided below with reference to FIGS. 4 to 7.

The organic light emitting layer 720 may be disposed on the first electrode 710 in the first opening 199 of the pixel defining layer 190, and the second electrode 730 may be disposed on the pixel defining layer 190 and the organic light emitting layer 720.

The OLED 70 including the first electrode 710, the organic light emitting layer 720, and the second electrode 730 may be formed as described above.

In an implementation, any one of the first electrode 710 and the second electrode 730 may include a transparent conductive material, and the other may include a transflective or reflective conductive material. According to kinds of materials included in the first electrode 710 and the second electrode 730, the OLED display 100 may be classified as a top-emission type, a bottom-emission type, or a dual-emission type.

The transparent conductive material may include one or more of, e.g., indium tin oxide (ITO), indium zinc oxide (IZO), zinc oxide (ZnO), or indium oxide ($In_2O_3$). The reflective material may include one or more of, e.g., lithium (Li), calcium (Ca), lithium fluoride/calcium (LiF/Ca), lithium fluoride/aluminum (LiF/Al), aluminum (Al), silver (Ag), magnesium (Mg), or gold (Au).

The organic light emitting layer 720 may include a low molecular weight organic material or a high molecular weight organic material. The organic light emitting layer 720 may have a multilayer structure including a light emission layer and one or more of a hole injection layer (HIL), a hole transporting layer (HTL), an electron transporting layer (ETL), or an electron injection layer (EIL). For example, the hole injection layer (HIL) may be disposed on the first electrode 710 serving as an anode, and the hole transporting layer (HTL), the light emission layer, the electron transporting layer (ETL), and the electron injection layer (EIL) may be sequentially laminated on the hole injection layer (HIL).

The organic light emitting layer 720 may be disposed, e.g., only in the first opening 199 of the pixel defining layer 190. In another implementation, at least one layer of the multilayer organic light emitting layer 720 may be disposed not only on the first electrode 710 in the first opening 199 of the pixel defining layer 190, but also between the pixel defining layer 190 and the second electrode 730. In example embodiments, the hole injection layer (HIL), hole transporting layer (HTL), electron transporting layer (ETL), and electron injection layer (EIL) of the organic light emitting layer 720 may be disposed on a part other than the first opening 199, e.g., using an open mask, and the light emission layer of the organic light emitting layer 720 may be disposed in the respective first openings 199, e.g., using a fine metal mask (FMM).

In the case of a liquid crystal display (LCD), the first electrode 710 may be physically and electrically connected to the driving drain electrode 177 through the contact hole 181, and may receive a data voltage from the driving drain electrode 177. An electric field may be generated by the first electrode 710 receiving the data voltage in conjunction with the second electrode (common electrode; not shown) receiving a common voltage, and may thereby determine a direction of liquid crystal molecules of a liquid crystal layer (not shown) between the two electrodes. The first electrode 710 and the second electrode may form a capacitor (hereinafter referred to as a "liquid crystal capacitor") so as to maintain the applied voltage after a thin film transistor is turned off.

A display device with the filler 30 including the scattering particles 40 will now be described in detail with reference to FIGS. 4 to 7.

Figure 4:
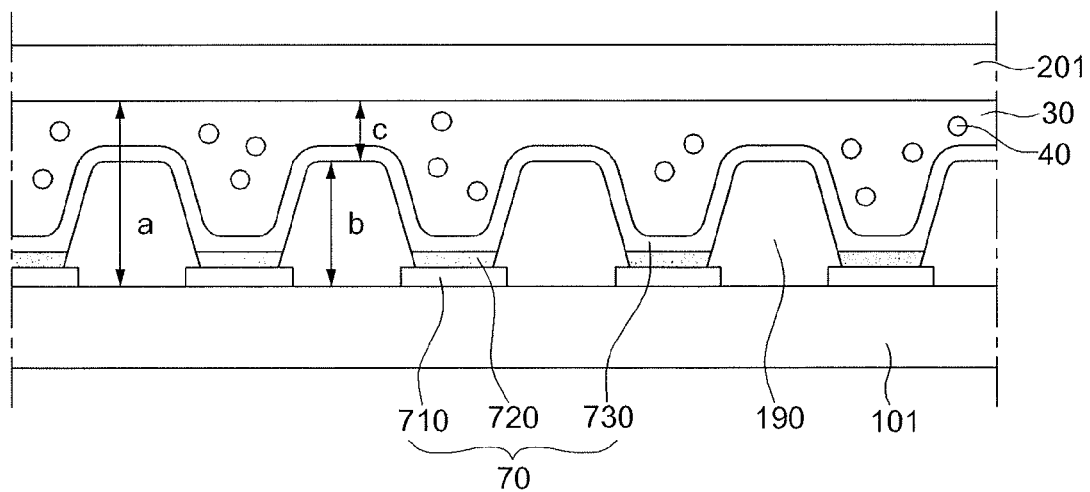
FIG. 4 illustrates a schematic cross-sectional view showing a first substrate, a second substrate, an organic light emitting diode, and a filler including scattering particles.
Figure 5:
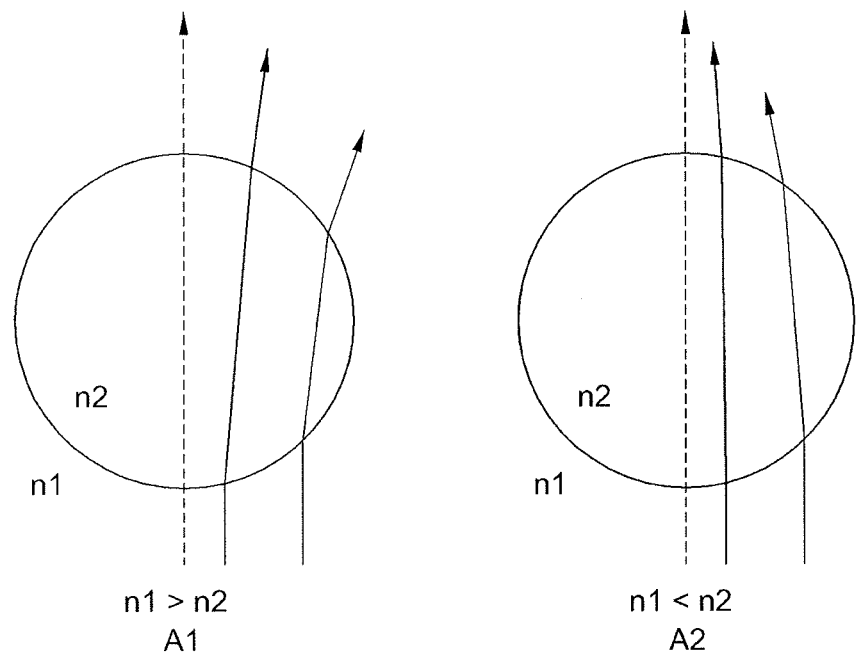
FIG. 5 illustrates a view showing a degree of light refraction according to refractive index differences between a filler and a scattering particle.
Figure 6:
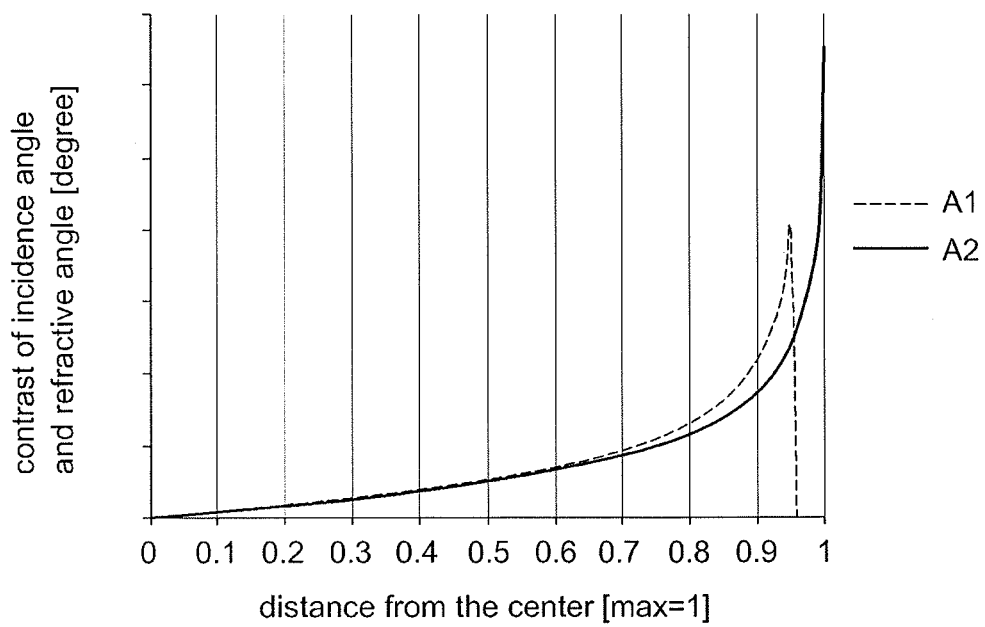
FIG. 6 illustrates a graph showing a refractive angle relative to an incidence angle of the scattering particle shown in FIG. 5.
Figure 7:
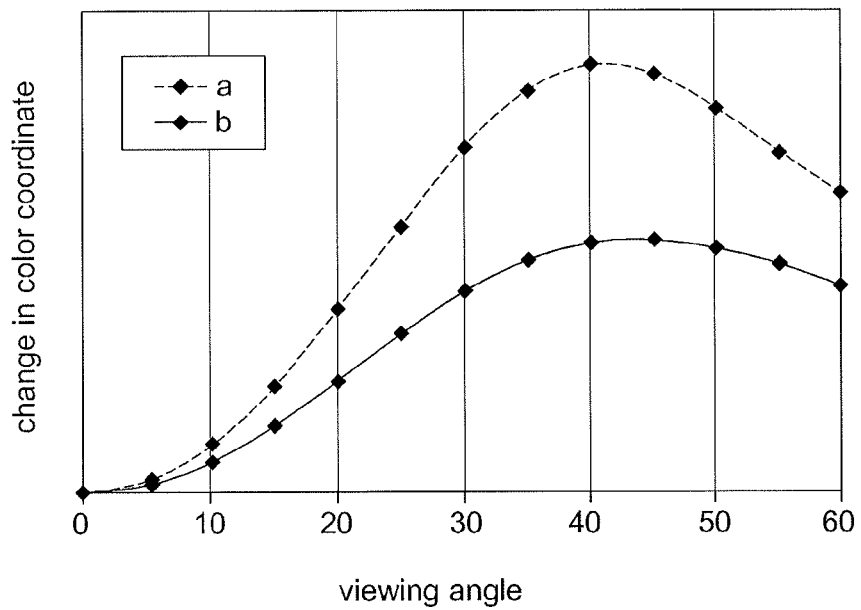
FIG. 7 illustrates a graph showing a change in color coordinates with respect to viewing angles in a filler includes scattering particles.

FIG. 4 illustrates a schematic cross-sectional view showing the first substrate, the second substrate, the OLED, and a filler including scattering particles. FIG. 5 illustrates a view showing a degree of light refraction according to refractive index differences between the filler and the scattering particle. FIG. 6 illustrates a graph showing a refractive angle relative to an incidence angle of the scattering particle shown in FIG. 5. FIG. 7 illustrates a graph showing a change in color coordinates with respect to viewing angles in the case of arranging the filler including the scattering particles.

Referring to FIG. 4, the filler 30 including the scattering particles 40 may be disposed between the first and second substrates 101 and 201. The scattering particles 40 may be dispersed in the filler 30. For example, the scattering particles 40 may be about 5% to about 40% with respect to the total volume of the filler 30 and the scattering particles 40.

The scattering particles 40 may have high dispersion stability by being well mixed with the filler 30, and may have an average particle size, e.g., an average particle diameter, that does not cause damage to inner elements. In the case where the scattering particles 40 are in contact with an inner element, the scattering particles 40 may have low hardness and suitable physical properties so as not to cause damage to the inner element, e.g., damage from changing a shape of the inner element. The scattering particles 40 may have a refractive index different from the filler 30.

Referring to FIG. 4, a degree of dispersion, an average particle size, and a material of the scattering particles 40 will be described below.

In FIG. 4, "a" represents a distance between the first and second substrates 101 and 201, "b" represents a height of the pixel defining layer 190, and "c" represents a distance between the pixel defining layer 190 and the second substrate 201. The scattering particles 40 may have an average particle diameter that is much smaller than the distance "a." The scattering particles 40 may be smaller in size than at least the distance "b." In an implementation, the space between the first and second substrates 101 and 201 may be minimized such that the distance "c" is 0.

As the average particle diameter of the scattering particle 40 becomes smaller, it is advantageous that the scattering particle 40 is less likely to be in contact with inner elements such as the organic light emitting layer 720. However, in the case where the average particle diameter of the scattering particle 40 is very small, a degree of dispersion may be lowered and light scattering effects may vary depending on specific light wavelengths (Mie scattering). Accordingly, the scattering particle 40 may have an average particle diameter of about 100 nm to about 20 µm. In the case of the scattering particle 40 with an average particle diameter of about 100 nm to about 20 µm, the degree of dispersion and light scattering effect of the scattering particle 40 may increase.

Materials of the scattering particle 40 and the filler 30 may have similar specific gravity and may have similar chemical properties to each other for dispersion stability. The filler 30 may include an organic material. For instance, the filler 30 may include one or more of a silicone resin, an epoxy resin, an acrylic resin, a polyimide resin, or a paraffin resin.

When an inorganic particle is used as the scattering particle 40, the scattering particle 40 may cause damage due to physical contact with the OLED 70. Accordingly, according to the present example embodiment, the scattering particle 40 may be made of a soft material that does not affect or damage the OLED 70. For example, the scattering particle 40 may include soft polymer beads. The soft polymer bead may be a spherical particle exhibiting elastic-plastic behavior. For example, the scattering particle 40 may include at least one organic polymer material such as acrylic, silicone, vinyl polymers, and the like.

In terms of softness, the soft polymer bead may have a glass transition temperature $T_g$ equal to or less than 120° C., a value of 10% K equal to or less than 500 Kg/cm$^2$, and a compressive fracture strength of 10 kg/mm$^2$. As the value of $T_g$ decreases, the soft polymer bead may have higher plasticity. The value of 10% K refers to a strength for 10% compression of the bead. As the value of 10% K becomes lower, higher plasticity may be exhibited. As the compressive fracture strength decreases, the plasticity of the soft polymer bead may increase. According to the present example embodiment, the soft polymer bead may be in a soft state that does not affect the OLED 70.

The filler 30 and the scattering particle 40 may be refined so as not to have an effect on the OLED 70, e.g., the filler 30 and the scattering particle 40 may be sufficiently refined, or degassing may be performed to remove gases from the filler 30 and the scattering particle 40. For instance, the filler 30 and the scattering particle 40 may be refined at 100° C., which may result in outgassing equal to or less than 500 ppm.

The scattering particle 40 may include a material having a low visible light absorption. In other words, the scattering particle 40 may include a material that absorbs less visible light emitted by the organic light emitting layer 720 in order to prevent luminance reduction caused by the scattering particle 40. The visible light absorption of the material is about 0.1% to about 8%. So, the visible light absorption of the scattering particle 40 is about 0.1% to about 8%.

The scattering particle 40 is illustrated as being round in FIGS. 3 and 4, but the scattering particle 40 may have various suitable shapes that produce effective dispersion degree and light refraction.

A light scattering effect may not vary depending on each refractive index of the filler 30 and the scattering particle 40 but may depend on the difference in the refractive indices between the filler 30 and the scattering particle 40, as described below with reference to FIGS. 5 and 6. The light scattering effect may be exhibited when the refractive index difference is 0.03 or more. Light scattering may occur when there is a refractive index difference between the filler 30 and the scattering particle 40, and the refractive index difference may range from, for example, about 0.03 to about 0.5.

Referring to FIG. 5, light refraction may occur because of different refractive indices of two media when light escapes from the center of a sphere and passes through the spherical structure according to general principles of light refraction, such as Snell's law. In this case, a refraction angle of the light may become larger as the distance from the center of the sphere increases. Whether the refracted light is dispersed or collected may depend on refractive indices of surrounding media and the scattering particle. The left side A1 of FIG. 5 shows light dispersion when the surrounding medium has a higher refractive index than the scattering particle. The right side A2 of FIG. 5 shows light collection when the scattering particle has a higher refractive index than the surrounding medium.

Referring to FIG. 6, it was confirmed experimentally that light is refracted when the refractive index difference between two different materials is about 0.05. As shown in A1 and A2, light may be refracted at a larger refraction angle relative to an incidence angle as each distance from the centers of the two different materials increases. In other words, light may be refracted at a greater refraction angle when it passes through a particle farther from the center of the particle. Thus, if there is a refractive index difference between the filler 30 and the scattering particle 40, light scattering may occur, regardless of the specific refractive indices of the filler 30 and the scattering particle 40.

Referring to FIG. 7, relative to a comparative change in color coordinates according to a viewing angle, a change in color coordinates may be reduced by 30% in a display according to example embodiments which utilizes the filler 30 including the scattering particle 40.

When large numbers of scattering particles 40 are included in the filler 30, luminance of a display device may decrease. Therefore, the amount of scattering particles 40 may range from about 5% to about 40% with respect to the total volume of the filler 30 and the scattering particle 40. The number or concentration of scattering particles 40 may be determined or adjusted by considering a reduction effect of a change in color coordinates and luminance of a display device.

When the filler 30 including the scattering particles 40 is used in a display device, it may be desirable to reduce ambient light reflection more than is provided by use of a phase difference method using a polarizing film. Therefore, a display device according to example embodiments may further include a black matrix and a color filter pattern to reduce ambient light reflection. Additional example embodiments will be provided below with reference to FIGS. 8 to 10.

Figure 8:
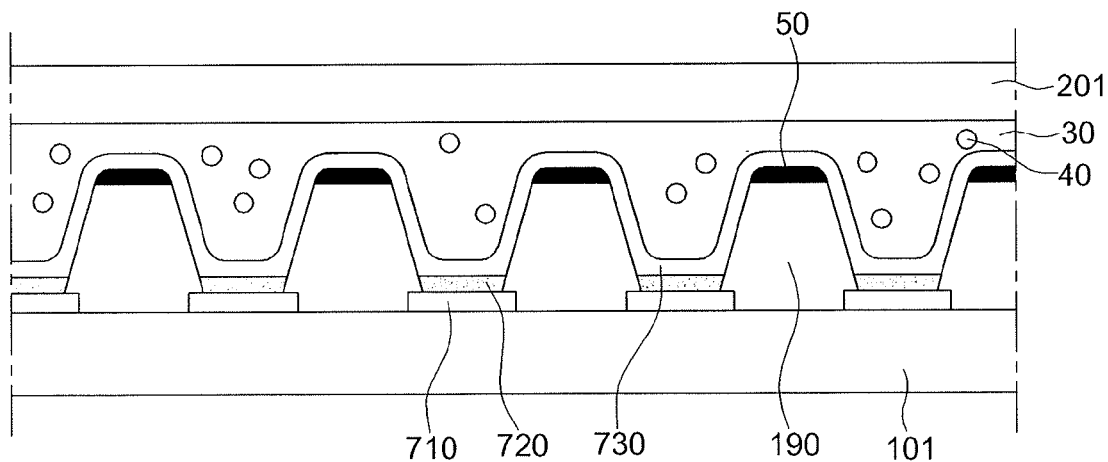
FIG. 8 illustrates a schematic cross-sectional view showing a first substrate, a second substrate, an organic light emitting diode, and a filler including scattering particles according to a second example embodiment.
Figure 9:
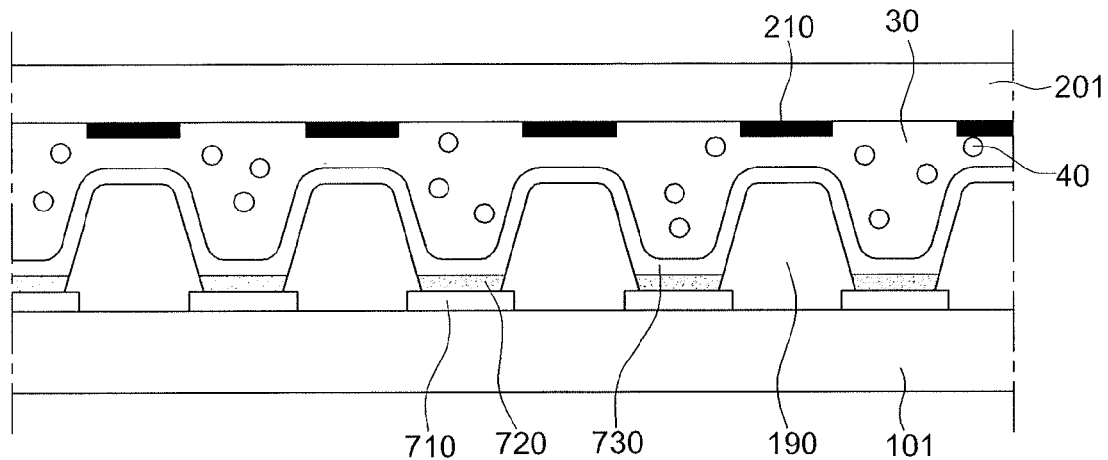
FIG. 9 illustrates a schematic cross-sectional view showing a first substrate, a second substrate, an organic light emitting diode, and a filler including scattering particles according to a third example embodiment.
Figure 10:
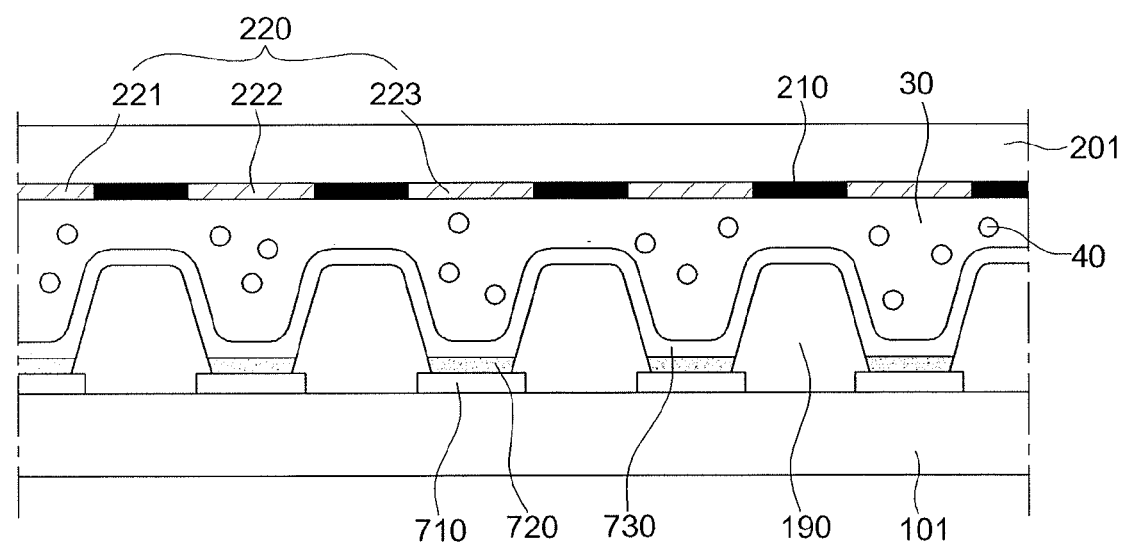
FIG. 10 illustrates a schematic cross-sectional view showing a first substrate, a second substrate, an organic light emitting diode, and a filler including scattering particles according to a fourth example embodiment.

FIG. 8 illustrates a schematic cross-sectional view showing a first substrate, a second substrate, an OLED, and a filler including scattering particles according to a second embodiment. FIG. 9 illustrates a schematic cross-sectional view showing a first substrate, a second substrate, an OLED, and a filler including scattering particles according to a third embodiment. FIG. 10 illustrates a schematic cross-sectional view showing a first substrate, a second substrate, an OLED, and a filler including scattering particles according to a fourth embodiment.

Referring to FIG. 8, a black matrix 50 may be disposed on a pixel defining layer 190. The black matrix 50 may be configured to block unnecessary light when an image is displayed. For example, the black matrix 50 may have a dielectric constant of about 3.0 or less and may be made of a black material with high thermal resistance and chemical resistance. The black matrix 50 may have a color with a low lightness value that is nearly black. The material which has a low lightness value near black may be particularly effective in blocking light.

Referring to FIG. 9, a black matrix 210 may be disposed on a second substrate 201 in a position corresponding to a pixel defining layer 190.

Referring to FIG. 10, color filter patterns 220 may be disposed between black matrices 210. The color filter patterns 220 may be configured to provide light transmitted through each pixel with colors. The color filter patterns 220 may include a first color filter pattern 221, a second color filter pattern 222, and a third color filter pattern 223. The first, second, and third color filter patterns 221, 222, and 223 may be red, green, and blue color filter patterns, respectively. The color filter patterns 220 may further include different colors in addition to, or instead of, the above colors. For example, a white color filter pattern may be further included. The black matrix 210 may be configured to prevent color mixture caused between the color filter patterns 220.

By way of summation and review, among flat panel displays, organic light emitting diode displays are self-emissive. In some displays, brightness may be slightly reduced depending on viewing angles. A resonance structure may be introduced to improve light extraction efficiency. However, such a structure may result in changes in color coordinates according to a viewing angle. In order to decrease the change of the color coordinates, a film having a pattern structure may be utilized but consideration should be given to the cost of the film having the pattern structure. In order to decrease the change of the color coordinates, scattering particles may be utilized but consideration should be given to the possibility that the scattering particles may damage elements inside the display device.

Example embodiments are directed to a display device including a filler including scattering particles. The display device may reduce or prevent color coordinates from changing with viewing angles. Thus, a separate pattern film may not be required, and costs may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first substrate;
   a second substrate facing the first substrate;
   a first electrode on the first substrate;
   a pixel defining layer on the first substrate, the pixel defining layer including an opening corresponding to the first electrode;
   a light emission layer on the first electrode;
   a second electrode on the light emission layer;
   a filler between the first substrate and the second substrate, the filler being directly on the second electrode and over the pixel defining layer;
   scattering particles in the filler, the scattering particles having an average particle diameter that is less than a maximum height of the pixel defining layer; and
   a black matrix between the pixel defining layer and the second electrode.

2. The display device as claimed in claim 1, wherein the scattering particles have an average particle diameter of about 100 nm to about 20 μm.

3. The display device as claimed in claim 1, wherein a difference between refractive indices of the filler and the scattering particles is about 0.03 to about 0.5.

4. The display device as claimed in claim 1, wherein the filler includes one or more of a silicone resin, an epoxy resin, an acrylic resin, a polyimide resin, or a paraffin resin.

5. The display device as claimed in claim 1, wherein the scattering particles are polymer beads, and the scattering particles are polymer beads having a glass transition temperature $T_g$ equal to or less than 120° C., and having a value of 10% K equal to or less than 500 kg/cm².

6. The display device as claimed in claim 1, wherein the filler includes the scattering particles in an amount of about 5% to about 40% of the total volume of the filler and the scattering particles.

7. The display device as claimed in claim 1, wherein the scattering particles include a material having a low visible light absorption.

8. The display device as claimed in claim 1, wherein the filler including the scattering particles has an outgas amount of about 500 ppm at a temperature of 100° C.

9. The display device as claimed in claim 1, wherein the second electrode is on the pixel defining layer.

10. The display device as claimed in claim 9, wherein the filler is between the second electrode and the second substrate.

11. A display device, comprising:
   a first substrate;
   a second substrate facing the first substrate;
   a first electrode on the first substrate;
   a pixel defining layer on the first substrate, the pixel defining layer including an opening corresponding to the first electrode;
   a light emission layer on the first electrode;
   a second electrode on the light emission layer;
   a filler between the first substrate and the second substrate, the filler being present between the first substrate and the second substrate over an uppermost surface of the pixel defining layer;
   scattering particles in the filler, the scattering particles having an average particle diameter that is less than a maximum height of the pixel defining layer; and
   a black matrix between the pixel defining layer and the second electrode.

12. A display device, comprising:
   a first substrate;
   a second substrate facing the first substrate;
   a first electrode on the first substrate;
   a pixel defining layer on the first substrate, the pixel defining layer including an opening corresponding to the first electrode;
   a black matrix in a position corresponding to the pixel defining layer;
   a color filter pattern between parts of the black matrix;
   a light emission layer on the first electrode;
   a second electrode on the light emission layer;
   a filler between the first substrate and the second substrate;
   scattering particles in the filler, the scattering particles having an average particle diameter that is less than a maximum height of the pixel defining layer; and
   a black matrix between the pixel defining layer and the second electrode.

* * * * *